(12) United States Patent
Kim et al.

(10) Patent No.: US 7,413,969 B2
(45) Date of Patent: Aug. 19, 2008

(54) METHOD OF MANUFACTURING SEMICONDUCTOR DEVICE HAVING RECESS GATE STRUCTURE WITH VARYING RECESS WIDTH FOR INCREASED CHANNEL LENGTH

(75) Inventors: Jong Man Kim, Kyoungki-do (KR); Chang Goo Lee, Kyoungki-do (KR); Jong Sik Kim, Kyoungki-do (KR); Se Ra Won, Kyoungki-do (KR)

(73) Assignee: Hynix Semiconductor Inc., Kyonngki-do (KR)

( * ) Notice: Subject to any disclaimer, the term of this patent is extended or adjusted under 35 U.S.C. 154(b) by 28 days.

(21) Appl. No.: 11/318,960

(22) Filed: Dec. 27, 2005

(65) Prior Publication Data

US 2007/0004145 A1   Jan. 4, 2007

(30) Foreign Application Priority Data

Jun. 30, 2005   (KR) .................... 10-2005-0058570

(51) Int. Cl.
*H01L 21/3205* (2006.01)
(52) U.S. Cl. ............... 438/589; 257/330; 257/E21.419; 257/E21.429
(58) Field of Classification Search ................. 438/282, 438/589, 700, 704, 706, 717, 740, 745, 259, 438/270; 257/330
See application file for complete search history.

(56) References Cited

U.S. PATENT DOCUMENTS

| 5,880,004 | A  | * | 3/1999 | Ho ............................. 438/421 |
| 2002/0064894 | A1 | * | 5/2002 | Lee ............................. 438/30 |
| 2005/0042833 | A1 | * | 2/2005 | Park et al. .................... 438/282 |
| 2005/0212026 | A1 | * | 9/2005 | Chung et al. ................. 257/301 |

FOREIGN PATENT DOCUMENTS

| CN | 15064950 | 6/2004 |
| JP | 11111837 | 4/1999 |
| KR | 1020000026816 | 5/2000 |
| KR | 1020000060693 | 10/2000 |
| WO | 03/103036 | 12/2003 |

OTHER PUBLICATIONS

Korean Patent Gazette issued by Korean Patent Office, Aug. 8, 2006.
Text of the First Office Action issued by the Chinese Patent Office.

* cited by examiner

*Primary Examiner*—Quoc Hoang
(74) *Attorney, Agent, or Firm*—Ladas & Parry LLP

(57) ABSTRACT

A varying-width recess gate structure having a varying-width recess formed in a semiconductor device can sufficiently increase the channel length of the transistor having a gate formed in the varying-width recess, thereby effectively reducing the current leakage and improving the refresh characteristics. In the method of manufacturing the recess gate structure, etching is performed twice or more, so as to form a gate recess having varying width in the substrate, and a gate is formed in the gate recess.

19 Claims, 2 Drawing Sheets

METHOD OF MANUFACTURING SEMICONDUCTOR DEVICE HAVING RECESS GATE STRUCTURE WITH VARYING RECESS WIDTH FOR INCREASED CHANNEL LENGTH

BACKGROUND OF THE INVENTION

1. Field of the Invention

The present invention relates generally to a method of manufacturing a semiconductor device, and more particularly to a method of manufacturing a semiconductor device having recess structure for increased channel length.

2. Description of the Prior Art

The conventional transistors having planar structures are unable to keep up with the technological demands of the recent advances in the integration of DRAM devices, such that, for example, these conventional transistors are unable to meet the required threshold target of the device in which the transistors are integrated. The advanced integration of DRAM devices requires reduction in the minimum feature size, and to reduce the minimum feature size the doping density is increased in a substrate, which inevitably increases the electric field as well as the function leakage in the transistor.

Therefore, a three-dimensional active structure called a "recess gate structure," which is considered to having effects on lowering the substrate doping density and reducing the junction leakage, is newly emerging.

According to the conventional recess gate structure, an active area for formation of a gate is recessed, and a gate is formed on the recessed area of the active area, thereby increasing the channel length. Such conventional recess gate structure formed in the given active area may be able to reduce the substrate doping density, thereby increasing the data retention time. Further, the increase in the channel length (due to the recess channel structure in the given active area) can improve the characteristics with respect to the drain induced barrier lowering (DIBL) and the breakdown voltages (BVds), thereby may be able to improve the overall cell properties.

Because the recess channel structure is shown to extend the data retention time by, for example, more than 200 ms, it is expected that the recess channel structure be utilized in the DRAM devices below a level of the sub-90 nm.

As mentioned above, a gate having the recess channel structure formed on the recessed area of the active area is capable of increasing the channel length. However, when the given active area is reduced, the channel length will also have to be reduced even in the case of the recess gate structure undercutting the advantages gained. Thus, there will be less reduction of leakage current in the junction area and near elimination of the improvement in the refresh characteristics of the devices. As a result, it is impossible to secure consistent reliability and yield for the devices with reduced active area.

SUMMARY OF THE INVENTION

Accordingly, the present invention has been made to solve the above-mentioned and other problems occurring in the prior art, and an object of the present invention is to provide a method of manufacturing a semiconductor device, which can sufficiently increase the channel length.

It is another object of the present invention to provide a method of manufacturing a semiconductor device, which can sufficiently increase the channel length, thereby effectively reducing current leakage and improving the refresh characteristics.

In order to accomplish this object, there is provided a method of manufacturing a semiconductor device, the method comprising the steps of: preparing a semiconductor substrate on which an isolation layer defining an active area is formed; sequentially forming an oxide layer, a poly-silicon layer, and a reflection-proof layer on the semiconductor substrate; forming a mask pattern defining an expected substrate recess area on the reflection-proof layer; etching the reflection-proof layer, the poly-silicon layer, and the oxide layer by using the mask pattern as an etching mask, thereby exposing the expected substrate recess area; performing a first etching on the expected substrate recess area, thereby forming a bowed first groove; eliminating the mask pattern and the reflection-proof layer; performing a second etching on a substrate portion at a bottom of the first groove by using the etched poly-silicon layer as an etching mask, thereby forming a second groove having a vertical side profile; eliminating the poly-silicon layer and the oxide layer; and forming a gate on the first groove including the second groove.

It is preferred that the first etching is performed by using a mixture solution in which HF, $NH_4F$, $HNO_3$, $CH_3COOH$, $H_2O_2$ and $H_2O$ are mixed. The mixture solution may contain 1~50% of $CH_3COOH$ solution. Also, the mixture solution may contain 1~50% of $HNO_3$ solution. It is also preferred that the first etching is performed at a temperature between 25 and 100° C. in order to improve an etching reactivity.

The first groove is formed to have a depth of 10~1000 Å.

Preferably, the second dry etching is performed by using a gas containing groups of HBr, $N_2$, Ar, Ne and Cl. Moreover, the second dry etching is a plasma dry etching in which the etching surface of the first groove is damaged, thereby breaking the crystal lattice on the etching surface.

The plasma dry etching is performed at a temperature between 25° C. and 700° C., at a pressure between 0.1~100 Torr, by a power between 10 and 2000 Watt, and under a reducing atmosphere. Further, in the plasma dry etching, one selected from the group consisting of Ne, He, $NH_3$, Kr, Xe and Rn is added as a catalyst gas.

The second groove is formed to have a depth of 300~3000 Å.

In accordance with another aspect of the present invention, there is provided a method of manufacturing a semiconductor device, the method comprising the steps of: preparing a semiconductor substrate on which an isolation layer defining an active area is formed; forming an insulation layer on the semiconductor substrate; forming a mask pattern defining an expected substrate recess area on the insulation layer; etching the insulation layer by using the mask pattern as an etching mask, thereby exposing the expected substrate recess area; performing a first isotropic etching on the expected substrate recess area, thereby forming a first groove; performing a second dry etching on a substrate portion at a bottom of the first groove, thereby forming a second groove; and forming a gate on the first groove including the second groove.

It is preferred that the first isotropic etching is performed by using a mixture solution in which HF, $NH_4F$, $HNO_3$, $CH_3COOH$, $H_2O_2$ and $H_2O$ are mixed. The mixture solution may contain 1~50% of $CH_3COOH$ solution. Also, the mixture solution may contain 1~50% of $HNO_3$ solution.

It is also preferred that the second dry etching is performed by using a gas containing groups of HBr, $N_2$, Ar, Ne and Cl. Moreover, the second dry etching may be a plasma dry etching in which the etching surface of the first groove is damaged, thereby breaking the crystal lattice on the etching surface.

The plasma dry etching is performed at a temperature between 25° C. and 700° C., at a pressure between 0.1~100

Torr, by a power between 10 and 2000 Watt, and under a reducing atmosphere. Moreover, in the plasma dry etching, one selected from the group consisting of Ne, He, $NH_3$, Kr, Xe and Rn is added as a catalyst gas.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

FIGS. 1A-1E are cross-sectional views for illustrating a method of manufacturing a semiconductor device according to an embodiment of the present invention.

Figure 1A:
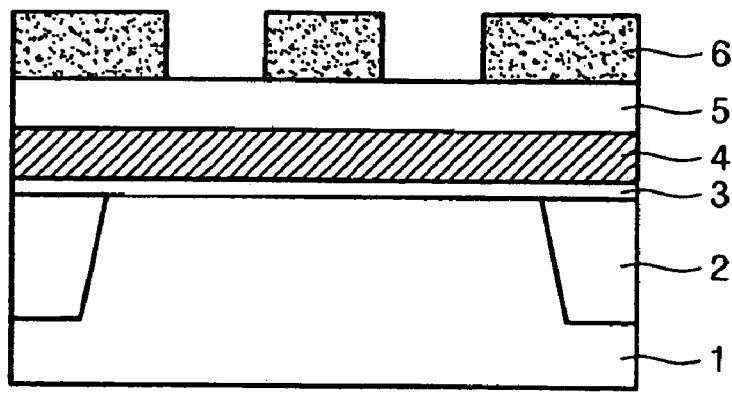
FIGS. 1A through 1E are sectional views for illustrating a method of manufacturing a semiconductor device according to an embodiment of the present invention.

Referring to FIG. 1A, an active area defined by two portions of isolation layer 2 is formed in a semiconductor substrate 1. Then, an oxide layer 3 and a poly-silicon layer 4 are sequentially formed on the active area and the portions of the isolation layer 2 in the semiconductor substrate 1. Thereafter, a reflection-proof layer 5 is formed on the poly-silicon layer 4, and a mask pattern 6 is formed on the reflection-proof layer 5 to define the areas that are to be recessed (or etched) into the substrate 1.

In the present embodiment, a poly-silicon layer 4 is used as a hard mask for forming recesses in the substrate 1. However, it is possible to use an insulation layer such as a nitride layer instead.

Figure 1B:
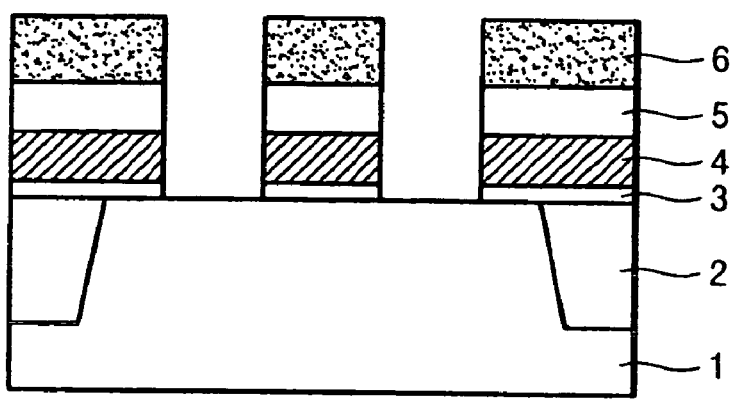

Referring to FIG. 1B, the reflection-proof layer 5, the poly-silicon layer 4, and the oxide layer 3 are sequentially etched by using the mask pattern 6 as an etching mask, thereby exposing the areas that are expected to be recessed in the active area of the substrate 1.

Figure 1C:
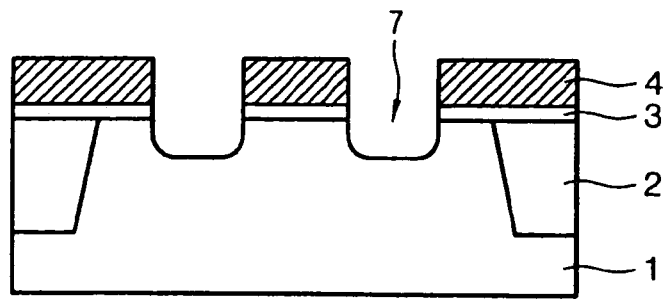

Referring to FIG. 1C, the exposed substrate area is etched through a first isotropic wet etching by using the mask pattern 6 as an etching mask, thereby forming a first recess 7 in the substrate 1. As shown in FIG. 1C, the bottom surface shape of the first recess 7 may be round or bowed shape; however, a sharp corner shape or other shapes are also possible. The first recess 7 is formed to have a depth of 10~1000 Å measured from the surface of the substrate 1. Thereafter, the recess gate mask pattern 6 and the reflection-proof layer 5 are removed.

The first isotropic wet etching is performed by using a solution in which HF, $NH_4F$, $HNO_3$, $CH_3COOH$, $H_2O_2$, and $H_2O$ are mixed. In order to improve the etching reactivity, the etching is performed at a temperature between 25° C. and 100° C. In the etching solution, $CH_3COOH$ is used as a stabilizer. Also, the etching solution contains an amount of $CH_3COOH$ solution, which corresponds to 1~50% of the entire solution. Further, $HNO_3$ is used as a chemical complement when $CH_3COOH$ is exhausted through reaction. Therefore, the etching solution contains an amount of $HNO_3$ solution, which corresponds to 1~50% of the entire solution.

Figure 1D:
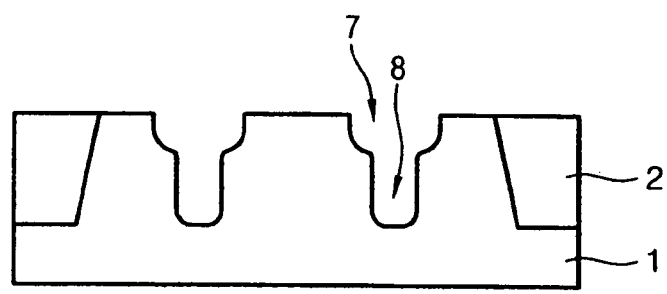

Referring to FIG. 1D, a portion at the bottom surface of the first recess 7 is further etched through a second dry etching, thereby forming a second recess 8 having a narrower width than the first recess 7. The second recess 8 is formed to have a depth of 300~3000 Å measured from the surface of the substrate 1. Thereafter, the poly-silicon layer 4 and the oxide layer 3 are removed. The second dry etching is performed by using gas containing HBr, $N_2$, Ar, Ne, and Cl.

In addition, for the second dry etching, a plasma dry etching is performed to damage the etching surface of the first groove 7 and break the crystal lattice on the etching surface. The plasma dry etching is performed at a temperature between 25° C. and 700° C., at a pressure between 0.1~100 Torr, by a power between 10 and 2000 Watts, and under a reducing atmosphere. Also, in the plasma dry etching, one selected from the group consisting of Ne, He, $NH_3$, Kr, Xe and Rn is added as a catalyst gas.

Figure 1E:
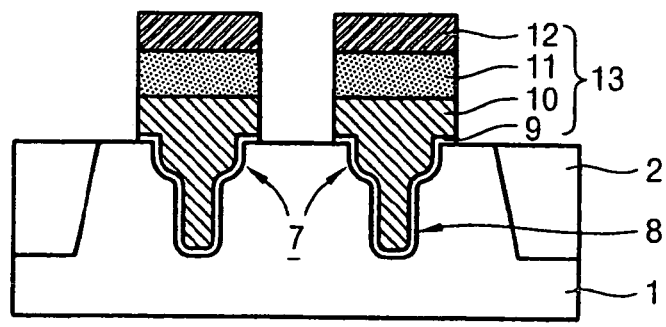

Referring to FIG. 1E, a gate oxide layer 9 is formed on the active area of the substrate 1 including the second recess 8 and the first recess 7. Then, a gate poly-silicon layer 10, a gate metal silicide layer 11, and a gate hard mask layer 12 are sequentially formed on the gate oxide layer 9.

Thereafter, the gate hard mask layer 12 is etched into a pattern, and the etched gate hard mask layer 12 is used to etch the gate metal silicide layer 11, the gate poly-silicon layer 10, and the gate oxide layer 9 under the gate hard mask layer 12, thereby forming a recess gate 13 (as shown in FIG. 1E) in the first and second recesses 7, 8.

Thereafter, although not shown, a series of known processing steps are sequentially performed, so as to complete the manufacturing of a semiconductor device having the recess gate 13 according to an embodiment of the present invention.

In a semiconductor device having a recess gate (such as 13) manufactured in the process according to an embodiment of the present invention as described above, the active area of the substrate (such as 1) is recessed through two steps of etching. Therefore, the semiconductor device of the present invention has an increased channel length when compared to the conventional semiconductor device having a recess gate formed through a single etching.

Therefore, according to the present invention, it is possible to secure a sufficient channel length by twice-etching the substrate active area on which a gate (such as 13) is expected to be formed, even when the active area is reduced. Therefore, the present invention can effectively reduce the current leakage of the junction area and improve the refresh characteristics. Therefore, the present invention can improve the reliability and yield of semiconductor devices through the reduction of current leakage and the improvement of the refresh characteristics.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device having a substrate with an active area defined by an isolation layer, the method comprising:

forming: an oxide layer or an insulation layer; a poly-silicon layer; and a reflection-proof layer on the active area of the semiconductor substrate;

forming a mask pattern defining an expected substrate recess area on the reflection-proof layer;

etching the reflection-proof layer, the poly-silicon layer, and the oxide layer or the insulation layer to expose the expected substrate recess area;

first etching the substrate of the expected recess area to form a first recess having a first recess width and a first recess depth;

removing the mask pattern and the reflection-proof layer;

second etching the substrate at the bottom surface of the first recess by using the etched poly-silicon layer as an etching mask to form a second recess having a second recess width and a second recess depth, wherein the first recess width is wider than the second recess width;

removing the poly-silicon layer and the oxide layer or the insulation layer; and forming a gate in the first and second recesses.

2. The method as claimed in claim 1, wherein the first etching is performed by using a mixture solution comprising HF, $NH_4F$, $HNO_3$, $CH_3COOH$, $H_2O_2$, and $H_2O$.

3. The method as claimed in claim 2, wherein the mixture solution contains 1~50% of $CH_3COOH$ solution.

4. The method as claimed in claim 2, wherein the mixture solution contains 1~50% of $HNO_3$ solution.

5. The method as claimed in claim 2, wherein the first etching step is performed at a temperature between 25° C. and 100° C.

6. The method as claimed in claim 1, wherein the first recess depth is 10~1000 Å measured from the surface of the substrate.

7. The method as claimed in claim 1, wherein the second etching step is performed by using a gas containing comprising HBr, $N_2$, Ar, Ne, and Cl.

8. The method as claimed in claim 7, wherein the second etching step further comprises a plasma dry etching in which the etching surface of the first recess is damaged, breaking the crystal lattice on the etching surface.

9. The method as claimed in claim 8, wherein the plasma dry etching is performed at a temperature between 25° C. and 700° C., at a pressure between 0.1~100 Torr, by a power between 10 and 2000 Watt, and under a reducing atmosphere.

10. The method as claimed in claim 8, wherein, in the plasma dry etching, one selected from the group consisting of Ne, He, $NH_3$, Kr, Xe and Rn is added as a catalyst gas.

11. The method as claimed in claim 1, wherein the second recess is formed to have a depth of 300~3000 Å measured from the surface of the substrate.

12. A method of manufacturing a semiconductor device having a substrate with an active area defined by an isolation layer, the method comprising:

forming an insulation layer on the semiconductor substrate;

forming a mask pattern defining an expected substrate recess area on the insulation layer;

etching the insulation layer by using the mask pattern as an etching mask, to expose the expected substrate recess area;

isotropic etching the substrate of the expected recess area to form a first recess having a first recess width and a first recess depth;

dry etching the substrate at a bottom of the first recess, to form a second recess having a second recess width and a second recess depth, wherein the first recess width is wider than the second recess width; and forming a gate including poly-silicon layer in both the first and second recesses.

13. The method as claimed in claim 12, wherein the first isotropic etching is performed by using a mixture solution comprising HF, $NH_4F$, $HNO_3$, $CH_3COOH$, $H_2O_2$ and $H_2O$.

14. The method as claimed in claim 13, wherein the mixture solution contains 1~50% of $CH_3COOH$ solution.

15. The method as claimed in claim 13, wherein the mixture solution contains 1~50% of $HNO_3$ solution.

16. The method as claimed in claim 12, wherein the second dry etching is performed by using a gas containing groups of HBr, $N_2$, Ar, Ne and Cl.

17. The method as claimed in claim 16, wherein the second dry etching step further comprising a plasma dry etching in which the etching surface of the first recess is damaged, breaking the crystal lattice on the etching surface.

18. The method as claimed in claim 17, wherein the plasma dry etching is performed at a temperature between 25° C. and 700° C., at a pressure between 0.1~100 Torr, by a power between 10 and 2000 Watt, and under a reducing atmosphere.

19. The method as claimed in claim 18, wherein, in the plasma dry etching, one selected from the group consisting of Ne, He, $NH_3$, Kr, Xe and Rn is added as a catalyst gas.

* * * * *